United States Patent
Hazama

[19]

[11] Patent Number: 6,144,585
[45] Date of Patent: *Nov. 7, 2000

[54] SEMICONDUCTOR STORAGE DEVICE FOR STORING THREE-OR MULTI-VALUED DATA IN ONE MEMORY CELL

[75] Inventor: Katsuki Hazama, Tokyo, Japan

[73] Assignee: Nippon Steel Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/890,600

[22] Filed: Jul. 9, 1997

Related U.S. Application Data

[62] Division of application No. 08/604,447, Feb. 21, 1996, Pat. No. 5,682,347, which is a division of application No. 08/362,785, Dec. 23, 1994, Pat. No. 5,515,321.

[30] Foreign Application Priority Data

Dec. 28, 1993 [JP] Japan .................................. 5-351867

[51] Int. Cl.[7] .................................................. G11C 11/34
[52] U.S. Cl. ................................ 365/185.22; 365/185.21
[58] Field of Search ......................... 365/185.17, 185.21, 365/185.22

[56] References Cited

U.S. PATENT DOCUMENTS

| | | | |
|---|---|---|---|
| 5,163,021 | 11/1992 | Mehrota ................................. | 365/168 |
| 5,200,920 | 4/1993 | Norman ............................ | 365/185.19 |
| 5,218,569 | 6/1993 | Banks ........................................ | 365/45 |
| 5,321,699 | 6/1994 | Endoh et al. ......................... | 371/21.5 |
| 5,386,422 | 1/1995 | Endoh et al. ......................... | 371/21.5 |
| 5,412,601 | 5/1995 | Sawada .................................. | 365/184 |
| 5,424,978 | 6/1995 | Wada ..................................... | 365/184 |
| 5,469,444 | 11/1995 | Endoh et al. ............................ | 371/215 |
| 5,485,422 | 1/1996 | Bauer et al. ............................ | 365/168 |
| 5,497,354 | 3/1996 | Sweha et al. ....................... | 365/230.06 |
| 5,539,690 | 7/1996 | Talreja et al. ..................... | 365/185.22 |
| 5,594,691 | 1/1997 | Bashir ................................ | 365/189.09 |
| 5,602,789 | 2/1997 | Endoh ................................ | 365/185.17 |
| 5,748,546 | 5/1998 | Bauer et al. ............................ | 365/210 |

FOREIGN PATENT DOCUMENTS 55-77082  6/1980  Japan .

OTHER PUBLICATIONS

Morris, Logic Circuits, 1983, McGraw–Hill, p. 242, line 1—p. 249, line 9.

Rich, A Survey of Multivalued Memories, IEEE Transactions on Computers, vol. 35, No. 2, Feb. 1986, pp. 99–106.

Krick, Three–State MNOS FET Memory Array, IBM Technical Disclosure Bulletin, vol. 18, No. 12, May 1976, pp. 4192–4193.

Horiguchi, et al., An Experimental Large–Capacity Semiconductor File Memory Using 16–level/cell Storage, IEEE Journal of Solid–State Circuits, vol. 23, No. 1, Feb.. 1988, pp. 27–33.

*Primary Examiner*—A. Zarabian
*Attorney, Agent, or Firm*—Pollock, Vande Sande & Amernick, RLLP

[57] ABSTRACT

A data reading method in a semiconductor storage device capable of storing three- or multi-valued data in one memory cell, in which the state of each memory cell is classified into a plurality of sets to thereby detect what set the present storage state of the memory cell belongs to. That is, several kinds of voltage values are applied to each memory cell to detect whether a current flows in the memory cell or not in accordance with the magnitude of the voltage values to thereby judge the present storage state of each memory cell.

65 Claims, 6 Drawing Sheets

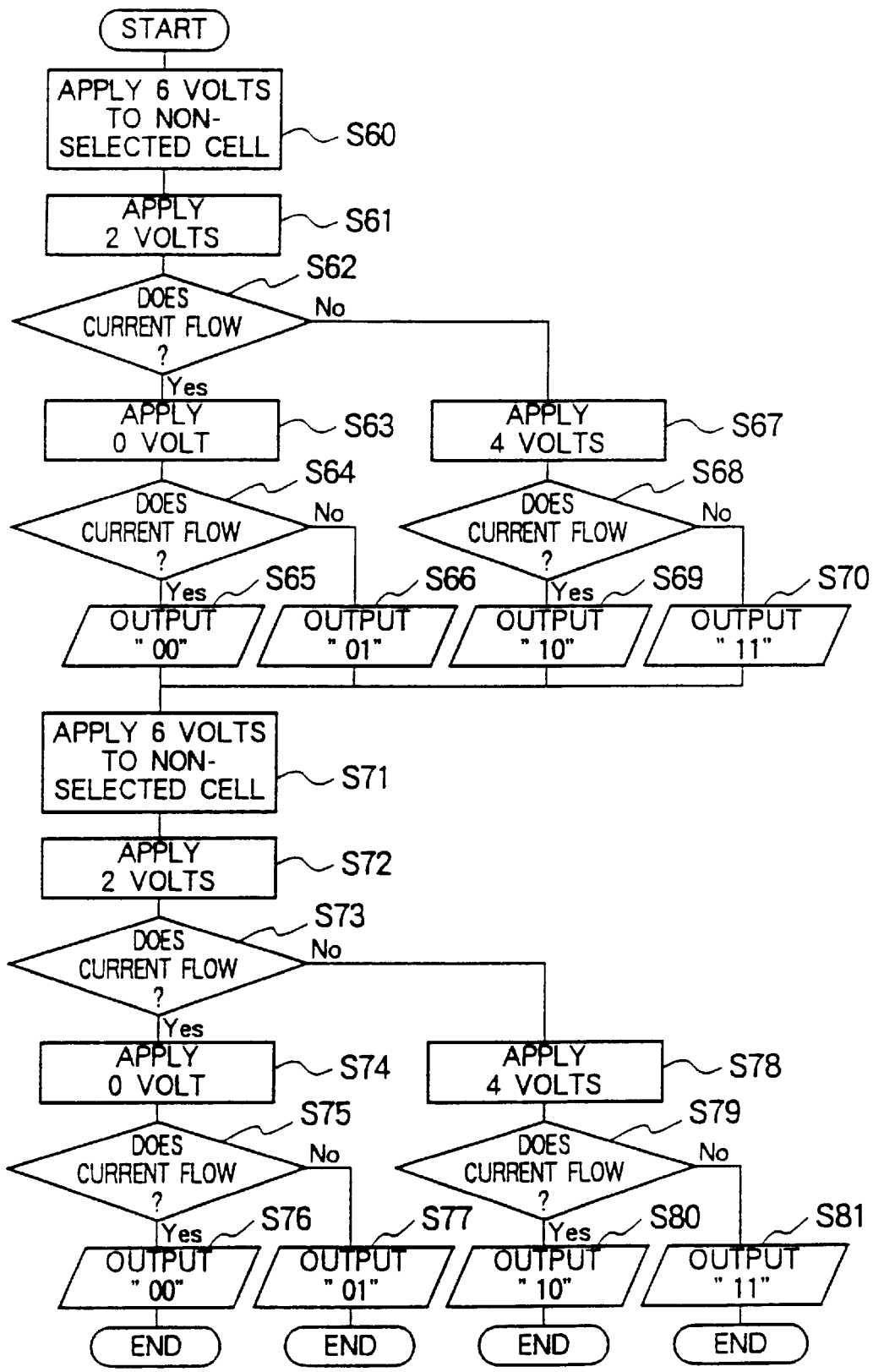

SEMICONDUCTOR STORAGE DEVICE FOR STORING THREE- OR MULTI-VALUED DATA IN ONE MEMORY CELL

This application is a Divisional of U.S. patent application Ser. No. 08/604,447, filed Feb. 21, 1996, now U.S. Pat. No. 5,682,347, which is a Divisional of Ser. No. 08/362,785, filed Dec. 23, 1994, now U.S. Pat. No. 5,515,321.

FIELD OF THE INVENTION

The present invention relates to a data reading method in a semiconductor storage device for storing three- or multi-valued data in one memory cell.

BACKGROUND OF THE INVENTION

In a semiconductor storage device such as an EEPROM (Electrically Erasable Programmable Read Only memory), or the like, put into practical use at present, no storage state but two kinds of storage states "0" and "1" can be set in one memory cell, so that the storage capacity of one memory cell is one bit (=two values). On the contrary, there has been proposed a semiconductor storage device in which four kinds of storage states "00" to "11" are set in one memory cell so that one memory cell has the storage capacity of two bits (=four values).

Such a semiconductor storage device as mentioned above (hereinafter referred to as "multi-valued memory") will be described below referring to an EEPROM as an example.

FIG. 6A is a schematic sectional view of a floating gate type memory cell 61 in a conventional EEPROM. In this drawing, a drain 63 and a source 64 constituted by n-type impurity diffusion layers respectively are formed in a surface region of a p-type silicon substrate 62 so that a channel region 70 is formed between the drain 63 and the source 64. Further, a bit line 65 formed by lamination and a source line 66 formed by lamination are electrically connected to the drain 63 and the source 64, respectively. Further, a tunnel insulating film 71 constituted by an $SiO_2$ film having a thickness of about 10 nm is formed on the channel region 70. A floating gate 67 constituted by low-resistance polysilicon, an interlayer insulating film 68 and a control gate (word line) 69 constituted by low-resistance polysilicon are formed successively on the tunnel insulating film 71. FIG. 6B is a connection diagram of this memory cell.

A method of writing four-valued data "00" to "11" into the memory cell 61 formed as described above and reading the data from the memory cell 61 will be described below.

Firstly, the case of writing will be described. When, for example, data "11" is to be written into the memory cell 61, the bit line 65 and the source line 66 are grounded and opened, respectively, and then a pulse voltage in a range of from about 10 v to about 15 V is applied to the control gate 69. By application of the pulse voltage, a potential is induced in the floating gate 67 so that a predetermined quantity of electric charges are injected into the floating gate 67 by Fowler-Nordheim tunnelling in accordance with the potential difference between the floating gate 67 and the drain 63. As a result, the threshold value of the gate voltage of the memory cell 61 increases to about 5 V. This state is defined as "11". When, for example, data "10", "01" or "00" is to be written into the memory cell, the threshold value of the gate voltage of the memory cell 61 can be set to be 3 V, 1 V or −1 V in the same manner as described above in the case of writing of data "11" while the voltage applied to the bit line 65 is selected to be 1 V, 2 V or 3 V.

Secondly, the case of reading will be described below. Generally, a field-effect transistor (FET) has such characteristic that a current flows across the source and drain of the FET if the voltage applied to the gate electrode of the FET is not lower than a threshold value in the case where a voltage is applied to the source or drain, while, on the contrary, no current flows across the source and drain of the FET if the voltage applied to the gate electrode of the FET is lower than the threshold value. Reading is executed by using this characteristic of the FET.

For example, a voltage of 1 V is applied to the bit line 65, while the source line 66 is set to 0 V. In this condition, voltages of 0 V, 2 V and 4 V are applied to the control gate 69 successively. If a current flows across the source and the drain when a voltage of 0 V is applied to the control gate 69, the threshold value of the gate voltage of the memory cell 61 is judged to be −1 V, and data "00" is therefore read out. On the other hand, if no current flows in the case of the gate voltage of 0 V but a current flows in the case of the gate voltage of 2 V, the threshold value of the gate voltage of the memory cell 61 is judged to be 1 V, and data "01" is therefore read out. Further, if no current flows in the case of the gate voltage of 0 V and in the case of the gate voltage of 2 V but a current flows first in the case of the gate voltage of 4 V, the threshold value of the gate voltage of the memory cell 61 is judged to be 3 V, and data "10" is therefore read out. Furthermore, if no current flows across the source and the drain in spite of the application of any of the above voltages to the control gate 69, the threshold value of the gate voltage of the memory cell 61 is judged to be 5 V, and data "11" is therefore read out.

Although the above description has been made regarding four-valued information, that is, two-bit information stored in one memory cell, researches have been made upon the case where multi-valued information capable of indicating more than four values is stored in one memory cell.

In the aforementioned data reading method in the conventional multi-valued memory, however, there arises a problem that the number of times of reading operation subjected to one memory cell increases.

When, for example, four-valued information is stored in one memory cell, three times reading operation in the gate voltage values of 0 V, 2 V and 4 V is required as described above. Although reading is practically performed while a voltage changed stepwise to be 0 V, 2 V and 4 V is applied to the control gate, the fact that three times reading operation is required remains unchanged.

When n-valued ($n \geq 2$) information is stored in one memory cell, (n−1) times of reading operation is generally required in the conventional reading method. In expression in the number of bits, when k-bit ($k \geq 1$) information is stored in one memory cell, ($2^k-1$) times of reading operation is generally required in the conventional reading method.

SUMMARY OF THE INVENTION

It is therefore an object of the present invention to provide a reading method in a semiconductor storage device in which the number of times of reading operation subjected to a multi-valued memory is reduced so that read access time can be shortened.

In order to attain the above object, according to an aspect of the present invention, a data reading method in a semiconductor storage device provided with at least one memory cell which has a control gate and an electric charge accumulating layer so that a threshold value of a gate voltage of the memory cell is controlled to be one $V_{th}(i)$ (in which i is an integer of 1 to n) of a number n ($n \geq 3$) of different values to thereby store three- or multi-valued information in one memory cell, comprises the steps of: applying a voltage $V_1$ represented by a relation $V_{th}(m_1) \leq V_1 < V_{th}(m_1+1)$ to the control gate of the memory cell to thereby detect whether a current flows across source and drain of the memory cell, where $m_1$ represents a maximum of integers not larger than $n/2$; applying a voltage $V_2$ represented by a relation $V_{th}(m_2) \leq V_2 < V_{th}(m_2+1)$ to the control gate of the memory cell to thereby detect whether a current flows across the source and drain of the memory cell when a current flows because of application of the voltage $V_1$, where $m_2$ represents a maximum of integers not larger than $n/4$; and applying a voltage $V_3$ represented by a relation $V_{th}(m_3) \leq V_3 < V_{th}(m_3+1)$ to the control gate of the memory cell to thereby detect whether a current flows across the source and drain of the memory cell when no current flows in spite of application of the voltage $V_1$, where $m_3$ represents a maximum of integers not larger than $3n/4$.

Preferably, in the case of n=4 the method comprises the steps of: applying a voltage $V_1$ represented by a relation $V_{th}(2) \leq V_1 < V_{th}(3)$ to the control gate of the memory cell to thereby detect whether a current flows across the source and drain of the memory cell; applying a voltage $V_2$ represented by a relation $V_{th}(1) \leq V_2 < V_{th}(2)$ to the control gate of the memory cell to thereby detect whether a current flows across the source and drain of the memory cell when a current flows because of application of the voltage $V_1$; outputting storage information at a threshold value of the gate voltage of the memory cell of $V_{th}(1)$ when a current flows because of application of the voltage $V_2$; outputting storage information at a threshold value of the gate voltage of the memory cell of $V_{th}(2)$ when no current flows in spite of application of the voltage $V_2$; applying a voltage $V_3$ represented by a relation $V_{th}(3) \leq V_3 < V_{th}(4)$ to the control gate of the memory cell to thereby detect whether a current flows across the source and drain of the memory cell when no current flows in spite of application of the voltage $V_1$; outputting storage information at a threshold value of the gate voltage of the memory cell of $V_{th}(3)$ when a current flows because of application of the voltage $V_3$; and outputting storage information at a threshold value of the gate voltage of the memory cell of $V_{th}(4)$ when no current flows in spite of application of the voltage $V_3$.

Preferably, the electric charge accumulating layer is constituted by a floating gate.

According to another aspect of the present invention, a data reading method in a semiconductor storage device provided with at least one memory cell which is constituted by a field-effect transistor so that a threshold value of a gate voltage of the memory cell is controlled to be one $V_{th}(i)$ (in which i is an integer of 1 to n) of a number n ($n \geq 3$) of different values to thereby store three- or multi-valued information in one memory cell, comprises the steps of: applying a voltage $V_1$ represented by a relation $V_{th}(m_1) \leq V_1 < V_{th}(m_1+1)$ to a gate of the memory cell to thereby detect whether a current flows across source and drain of the memory cell, where $m_1$ represents a maximum of integers not larger than $n/2$; applying a voltage $V_2$ represented by a relation $V_{th}(m_2) \leq V_2 < V_{th}(m_2+1)$ to the gate of the memory cell to thereby detect whether a current flows across the source and drain of the memory cell when a current flows because of application of the voltage $V_1$, where $m_2$ represents a maximum of integers not larger than $n/4$; and applying a voltage $V_3$ represented by a relation $V_{th}(m_3) \leq V_3 < V_{th}(m_3+1)$ to the gate of the memory cell to thereby detect whether a current flows across the source and drain of the memory cell or not when no current flows in spite of application of the voltage $V_1$, where $m_3$ represents a maximum of integers not larger than $3n/4$.

According to a further aspect of the present invention, a data reading method in a semiconductor storage device provided with at least one memory cell which has a control gate and an electric charge accumulating layer so that a threshold value of a gate voltage of the memory cell is controlled to be one of a plurality of different values to thereby store three- or multi-valued data in one memory cell, comprises: a first step of applying a first voltage having a value larger than a predetermined one of the plurality of different values to the control gate of the memory cell to thereby detect whether a current flows across source and drain of the memory cell; a second step of applying a second voltage having a value smaller than the value of the first voltage to the control gate of the memory cell to thereby detect whether a current flows across the source and drain of the memory cell when it is confirmed in the first step that a current flows; and a third step of applying a third voltage having a value higher than the value of the first voltage to the control gate of the memory cell to thereby detect whether a current flows across the source and drain of the memory cell or not when it is confirmed in the first step that no current flows.

BRIEF DESCRIPTION OF THE DRAWINGS

FIG. 5 is a flow chart of a reading method according to the third embodiment of the present invention;

DESCRIPTION OF THE PREFERRED EMBODIMENTS

Figure 2:
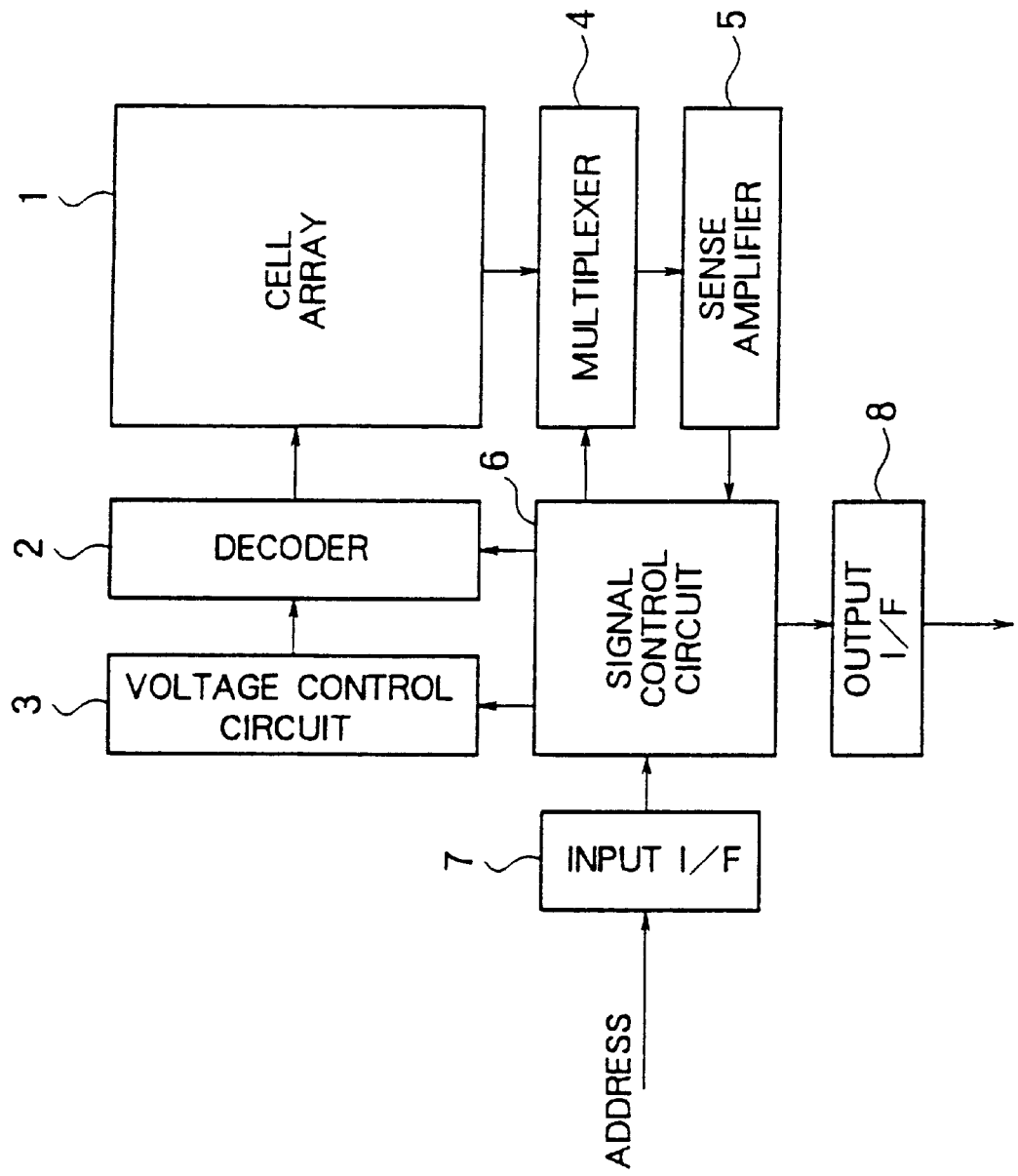
FIG. 2 is a block diagram showing the main structure of an EEPROM used in the first embodiment of the present invention.
Figure 6A:
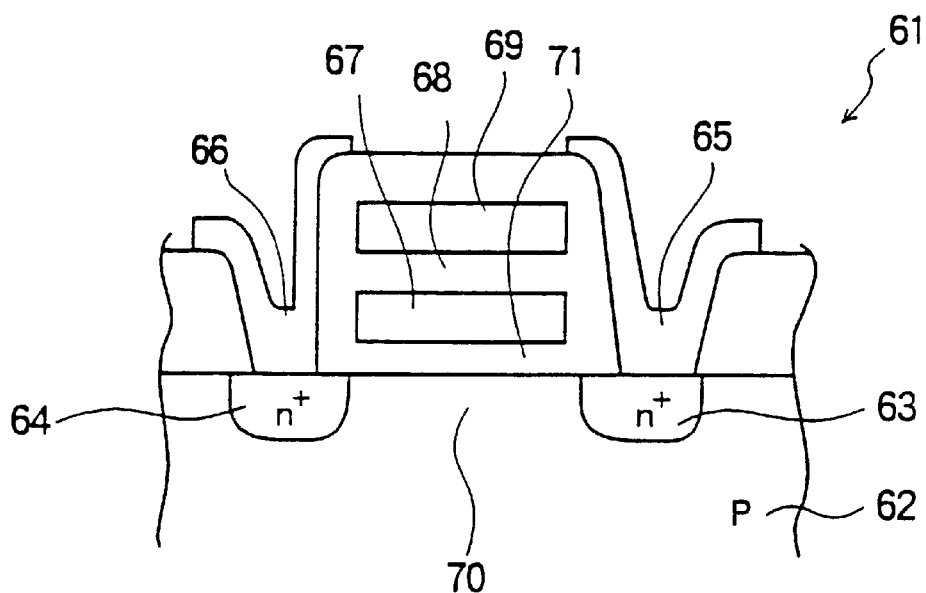
FIG. 6A is a schematic sectional view of a conventional floating gate type memory cell.
Figure 6B:
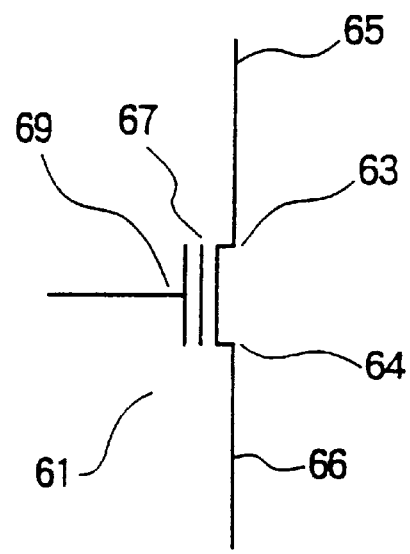
FIG. 6B is a connection diagram of the floating gate type memory cell.

Referring now to FIG. 2, there is shown the main structure of a semiconductor storage device to which the present invention is applied. In this drawing, the reference numeral 1 designates a cell array which has a plurality of memory cells arranged lengthwise and widthwise in the form of a matrix (not shown). Each of these memory cells is a floating gate type memory cell having substantially the same structure as that described with reference to FIGS. 6A and 6B. Though not shown, control gates, drains and sources of the memory cells are connected to word lines, to bit lines and to a common source line, respectively. The word lines are arranged in the direction of the columns of the cell array and are connected to a decoder 2. On the other hand, the bit lines are arranged in the direction of of the rows of the cell array and are connected to a multiplexer 4. The sources are grounded. Through the decoder 2, a voltage control circuit 3 applies a predetermined voltage value to a word line selected from the plurality of word lines in the cell array.

The multiplexer 4 supplies the voltage value of the selected bit line in the cell array to a sense amplifier 5. The sense amplifier 5 detects the presence or absence of the selected bit line and supplies the result of detection to a signal control circuit 6. The signal control circuit 6 receives data supplied from the outside through an input interface (I/F) 7 as an address signal, determines the word line and bit line to be selected on the basis of this address signal and supplies the results of determination to the decoder 2 and to the multiplexer 4, respectively. Further, a voltage value to be next applied to the control gate of the selected memory cell is determined on the basis of the result of detection in the sense amplifier 5, so that a result of the determination is supplied to the voltage control circuit 3. Further, data in the selected memory cell is supplied to the outside through an output I/F 8.

The operation of this embodiment configured as described above will be described below. In the case of reading operation, an address signal from the outside is inputted into the signal control circuit 6 through the input I/F 7. Upon reception of the address signal, the signal control circuit 6 determines a word line and a bit line to be selected in the cell array on the basis of the supplied address signal and supplies the results of determination as instructions to the decoder 2 and the multiplexer 4, respectively. The decoder 2 and the multiplexer 4 select the word line and the bit line, respectively, on the basis of these instructions. Further, the signal control circuit 6 determines the magnitude of a voltage to be applied to the control gate of the selected memory cell and supplies the result of determination as an instruction to the voltage control circuit 3. The voltage control circuit 3 applies a predetermined voltage to the selected word line through the decoder 2. On the other hand, a predetermined voltage is applied to the selected bit line by the multiplexer 4. As a result, whether a current flows in the selected bit line or not is determined in accordance with the state of the threshold value of the selected memory cell. The state of the current in the selected bit line is transmitted from the multiplexer 4 to the sense amplifier 5. The sense amplifier 5 detects the presence or absence of the current in the selected bit line and transmits the result of detection to the signal control circuit 6. The signal control circuit 6 determines a voltage to be next applied to the control gate of the selected memory cell on the basis of the result of the detection in the sense amplifier 5 and supplies the result of determination as an instruction to the voltage control circuit 3. Further, the signal control circuit 6 outputs, through the output I/F 8, the storage data of the selected memory cell finally obtained by repeating the aforementioned procedure.

Figure 1:
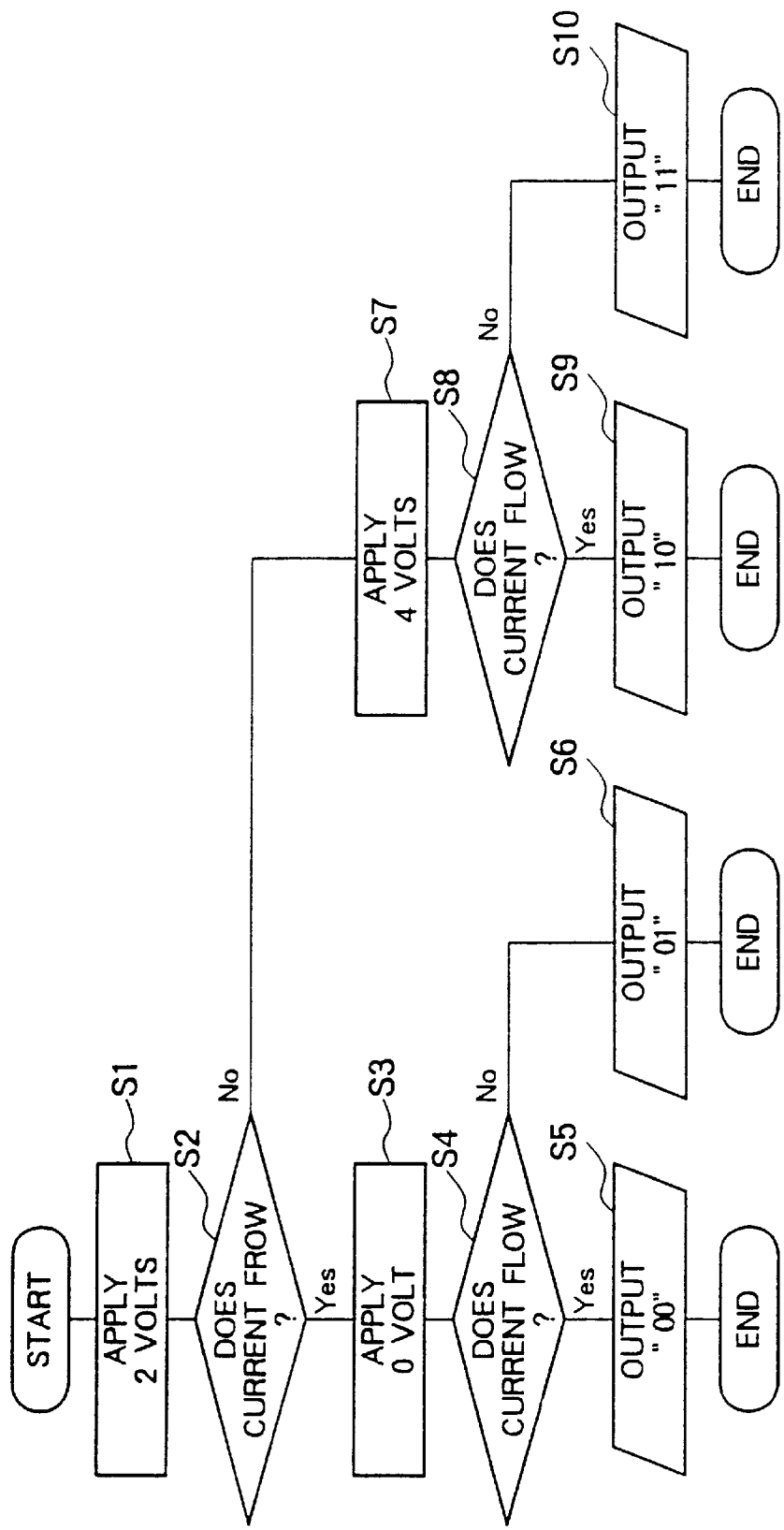
FIG. 1 is a flow chart of a reading method according to a first embodiment of the present invention.

FIG. 1 shows a flow chart of reading operation according to the first embodiment of the present invention. In this embodiment, assume that the gate voltage of each of the memory cells takes any one of the threshold values −1 V, 1 V, 3 V and 5 V. That is, assume that each memory cell has a storage capacity of two bits (=four values).

First, the signal control circuit 6 instructs the voltage control circuit 3 to apply a voltage of 2 V to the control gate of the selected memory cell. In this occasion, a voltage of 5 V is applied to the drain (step S1).

Then, it is detected whether a current flows across the drain and source of the selected memory cell through the selected bit line and the next sense amplifier 5 (step S2).

When it is confirmed in the step S2 that a current flows across the drain and source of the selected memory cell, that is, when current conduction is made in the selected memory cell, the threshold value of the gate voltage of the memory cell is judged to be either −1 V or 1 V, so that the signal control circuit 6 instructs the voltage control circuit 3 to apply a voltage of 0 V to the control gate of the selected memory cell nextly (step S3).

Then, it is detected whether a current flows across the drain and source of the selected memory cell (step S4). When a current flows, the threshold value of the gate voltage of the memory cell is judged to be −1 V, so that "00" as storage data of the memory cell is outputted through the output I/F 8 (step S5). When it is otherwise confirmed in the step S4 that no current flows, the threshold value of the gate voltage of the memory cell is judged to be 1 V, so that "01" as storage data of the memory cell is outputted (step S6).

When it is confirmed in the step S2 that no current flows across the drain and source of the selected memory cell, the threshold value of the gate voltage of the memory cell is judged to be either 3 V or 5 V, so that the signal control circuit 6 instructs the voltage control circuit 3 to apply next a voltage of 4 V to the control gate of the selected memory cell (step S7).

Then, it is detected whether a current flows across the drain and source of the selected memory cell (step S8). When a current flows, the threshold value of the gate voltage of the memory cell is judged to be 3 V, so that "10" as storage data of the memory cell is outputted through the output I/F 8 (step S9). When it is confirmed in the step S8 that no current flows, the threshold value of the gate voltage of the memory cell is judged to be 5 V, so that "11" as storage data of the memory cell is outputted (step S10).

As described above, according to the reading method of this embodiment, reading of data from one memory cell having a storage capacity of two bits can be performed by two times reading operation. Although the conventional method requires three times reading operation by application of all voltages 0 V, 2 V and 4 V, the number of times of necessary reading operation is reduced according to the method of this embodiment. Accordingly, access time can be reduced.

Figure 3:
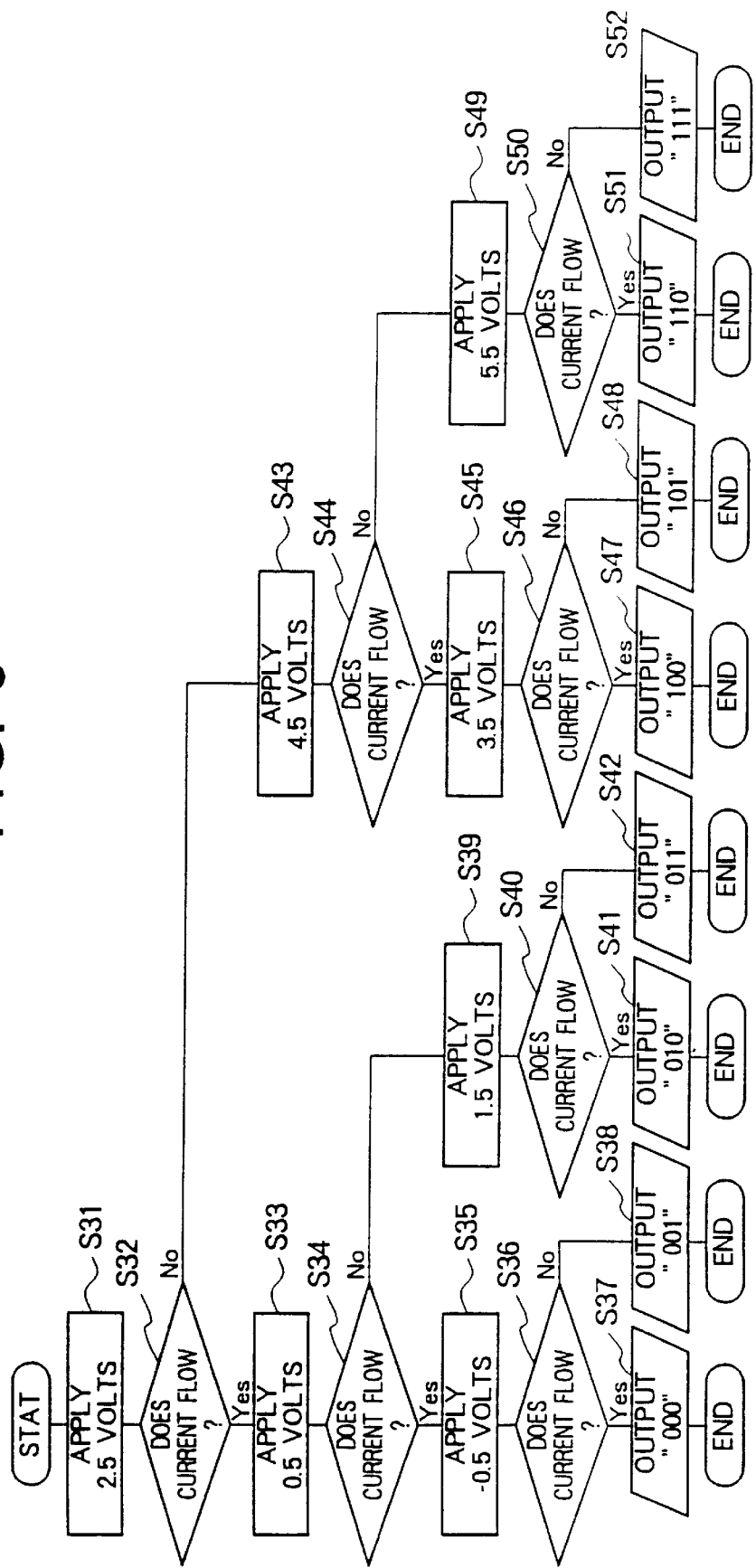
FIG. 3 is a flow chart of a reading method according to a second embodiment of the present invention.

Referring to FIG. 3, a second embodiment of the present invention will be described below. In this embodiment, the gate voltage of each of the memory cells takes any one of threshold values −1 V, 0 V, 1 V, 2 V, 3 V, 4 V, 5 V and 6 V. That is, each of the memory cells has a storage capacity of three bits (=eight values).

First, the signal control circuit 6 instructs the voltage control circuit 3 to apply a voltage of 2.5 V to the control gate of a selected memory cell. In this occasion, a voltage of 5 V is applied to the drain of the selected memory cell (step S31).

Then, it is detected whether a current flows across the drain and source of the selected memory cell through the selected bit line and the sense amplifier 5 (step S32).

When it is confirmed in the step S32 that a current flows across the drain and source of the selected memory cell, that is, when current conduction is made in the selected memory cell, the threshold value of the gate voltage of the memory cell is judged to be either −1 V or 2 V, so that the signal control circuit 6 instructs the voltage control circuit 3 to apply next a voltage of 0.5 V to the control gate of the selected memory cell (step S33).

Then, it is detected whether a current flows across the drain and source of the selected memory cell (step S34).

When it is confirmed in the step S34 that a current flows across the drain and source of the selected memory cell, the threshold value of the gate voltage of the memory cell is judged to be either −1 V or 0 V, so that the signal control circuit 6 instructs the voltage control circuit 3 to apply a voltage of −0.5 V to the control gate of the selected memory cell (step S35).

Then, it is detected whether a current flows across the drain and source of the selected memory cell (step S36).

When a current flows, the threshold value of the gate voltage of the memory cell is judged to be −1 V, so that "000" as storage data of the memory cell is outputted through the output I/F 8 (step S37). When it is otherwise confirmed in the step S36 that no current flows, the threshold value of the gate voltage of the memory cell is judged to be 0 V, so that "001" as storage data of the memory cell is outputted (step S38).

When it is confirmed in the step S34 that no current flows across the drain and source of the selected memory cell, the threshold value of the gate voltage of the memory cell is judged to be either 1 V or 2 V, so that the signal control circuit 6 instructs the voltage control circuit 3 to apply a voltage of 1.5 V to the control gate of the selected memory cell (step S39).

Then, it is detected whether a current flows across the drain and source of the selected memory cell (step S40). When a current flows, the threshold value of the gate voltage of the memory cell is judged to be 1 V, so that "010" as storage data of the memory cell is outputted through the output I/F 8 (step S41). When it is confirmed in the step S40 that no current flows, the threshold value of the gate voltage of the memory cell is judged to be 2 V, so that "011" as storage data of the memory cell is outputted (step S42).

When it is confirmed in the step S32 that no current flows across the drain and source of the selected memory cell, the threshold value of the gate voltage of the memory cell is judged to be any one of values 3 V to 6 V, so that the signal control circuit 6 instructs the voltage control circuit 3 to apply next a voltage of 4.5 V to the control gate of the selected memory cell (step S43).

Then, it is detected whether a current flows across the drain and source of the selected memory cell (step S44).

When it is confirmed in the step S44 that a current flows across the drain and source of the selected memory cell, the threshold value of the gate voltage of the memory cell is judged to be either 3 V or 4 V, so that the signal control circuit 6 instructs the voltage control circuit 3 to apply next a voltage of 3.5 V to the control gate of the selected memory cell (step S45).

Then, it is detected whether a current flows across the drain and source of the selected memory cell (step S46). When a current flows, the threshold value of the gate voltage of the memory cell is judged to be 3 V, so that "100" as storage data of the memory cell is outputted through the output I/F 8 (step S47). When it is confirmed in the step S46 that no current flows, the threshold value of the gate voltage of the memory cell is judged to be 4 V, so that "101" as storage data of the memory cell is outputted (step S48).

When it is confirmed in the step S44 that no current flows across the drain and source of the selected memory cell, the threshold value of the gate voltage of the memory cell is judged to be either 5 V or 6 V, so that the signal control circuit 6 instructs the voltage control circuit 3 to apply next a voltage of 5.5 V to the control gate of the selected memory cell (step S49).

Then, whether a current flows across the drain and source of the selected memory cell (step S50). When a current flows, the threshold value of the gate voltage of the memory cell is judged to be 5 V, so that "110" as storage data of the memory cell is outputted through the output I/F 8 (step S51). When it is confirmed in the step S50 that no current flows, the threshold value of the gate voltage of the memory cell is judged to be 6 V, so that "111" as storage data of the memory cell is outputted (step S52).

As described above, according to the reading method of this embodiment, reading of data from one memory cell having a storage capacity of three bits can be performed by three times reading operation, so that the number of times of necessary reading operation is reduced greatly. As a result, access time can be shortened greatly.

Figure 4:
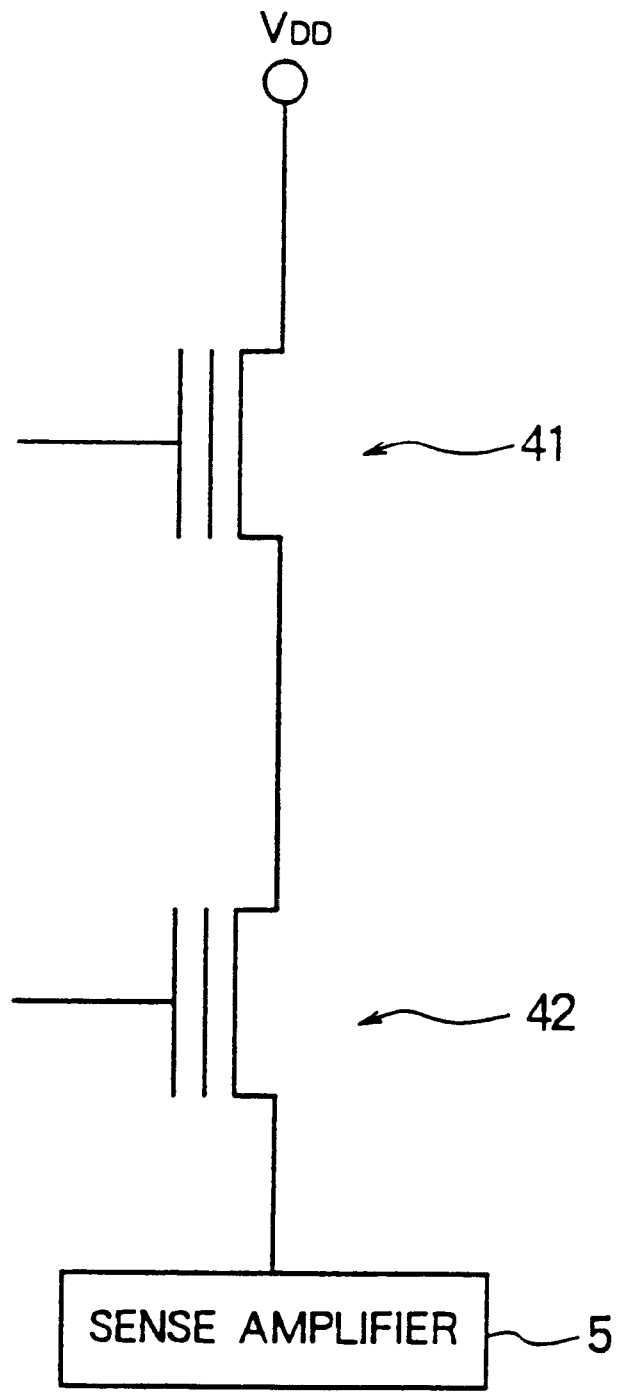
FIG. 4 is a schematic connection diagram showing an NAND type block used in a third embodiment of the present invention and having two memory cells series-connected.

Referring to FIGS. 4 and 5, a third embodiment of the present invention will be described below.

As shown in FIG. 4, in this embodiment, reading is made from an NAND type block having two memory cells 41 and 42 series-connected and each having a storage capacity of two bits. The gate voltage of each of the memory cells takes any one of threshold values −1 V, 1 V, 3 V and 5 V. In this embodiment, higher significant two bits and lower significant two bits are stored in the memory cells 41 and 42, respectively, so that information of four bits in total is stored in the two memory cells.

FIG. 5 is a flow chart of reading operation. In order to read information of higher significant two bits stored in a memory cell 41, a voltage of 6 V is applied to the gate of a non-selected memory cell 42 (step S60) so that the memory cell 42 is turned to a current conduction state even in the case where the threshold value of the gate voltage is any one of values −1 V, 1 V, 3 V and 5 V.

The method of reading data from the selected memory cell 41 in this condition is the same as that described previously in the first embodiment. That is, a voltage of 2 V is applied to the control gate of the selected memory cell 41 (step S61) and whether a current flows in a corresponding bit line or not is detected by the sense amplifier 5 to thereby detect whether current conduction is made in the selected memory cell 41 (step S62). Incidentally, the input potential of the sense amplifier 5 is set to be 0 V and a voltage of 5 V is applied to the drain terminal $V_{DD}$ of the memory cell 41.

When it is confirmed in the step S62 that current conduction is made in the selected memory cell 41, the threshold value of the gate voltage of the selected memory cell 41 is judged to be either −1 V or 1 V, so that a voltage of 0 V is applied next to the control gate of the selected memory cell 41 (step S63) to detect whether current conduction is made in the selected memory cell 41 (step S64). When it is confirmed in the step S64 that current conduction is made in the selected memory cell 41, the threshold value of the gate voltage of the selected memory cell 41 is judged to be −1 V, so that "00" as higher significant bit data is outputted (step S65). When it is confirmed in the step S64 that current conduction is not made in the selected memory cell 41, the threshold value of the gate voltage of the selected memory cell 41 is judged to be 1 V, so that "01" as higher significant bit data is outputted (step S66).

When it is confirmed in the step S62 that current conduction is not made in the selected memory cell 41, the threshold value of the gate voltage of the selected memory cell 41 is judged to be either 3 V or 5 V, so that a voltage of 4 V is applied next to the control gate of the selected memory cell 41 (step S67) to detect whether current conduction is made in the selected memory cell 41 (step S68). When it is confirmed in the step S68 that current conduction is made in the selected memory cell 41, the threshold value of the gate voltage of the selected memory cell 41 is judged to be 3 V, so that "10" as higher significant bit data is outputted (step S69). When it is confirmed in the step S68 that current conduction is not made in the selected memory cell 41, the threshold value of the gate voltage of the selected memory cell 41 is judged to be 5 V, so that "11" as higher significant bit data is outputted (step S70).

Then, information of lower significant two bits stored in the memory cell 42 is to be read out. In order to read the information, a voltage of 6 V is applied to the gate of the non-selected memory cell 41 (step S71) so that the non-selected memory cell 41 is turned to a current conduction state.

Further, a voltage of 2 V is applied to the control gate of the selected memory cell 42 (step S72) and whether a current flows in a corresponding bit line is detected by the sense amplifier 5 to thereby detect whether current conduction is made in the selected memory cell 42 or not (step S73).

When it is confirmed in the step S73 that current conduction is made in the selected memory cell 42, the threshold value of the gate voltage of the selected memory cell 42 is judged to be either −1 V or 1 V, so that a voltage of 0 V is applied next to the control gate of the selected memory cell 42 (step S74) to detect whether current conduction is made in the selected memory cell 42 or not (step S75). When it is confirmed in the step S75 that current conduction is made in the selected memory cell 42, the threshold value of the gate voltage of the selected memory cell 42 is judged to be −1 V, so that "00" as lower significant bit data is outputted (step S76). When it is confirmed in the step S75 that current conduction is not made in the selected memory cell 42, the threshold value of the gate voltage of the selected memory cell 42 is judged to be 1 V, so that "01" as lower significant bit data is outputted (step S77).

When it is confirmed in the step S73 that current conduction is not made in the selected memory cell 42, the threshold value of the gate voltage of the selected memory cell 42 is judged to be either 3 V or 5 V, so that a voltage of 4 V is applied next to the control gate of the selected memory cell 42 (step S78) to detect whether current conduction is made in the selected memory cell 42 (step S79). When it is confirmed in the step S79 that current conduction is made in the selected memory cell 42, the threshold value of the gate voltage of the selected memory cell 42 is judged to be 3 V, so that "10" as lower significant bit data is outputted (step S80). When it is confirmed in the step S79 that current conduction is not made in the selected memory cell 42, the threshold value of the gate voltage of the selected memory cell 42 is judged to be 5 V, so that "11" as lower significant bit data is outputted (step S81).

As described above, according to the reading method of this embodiment, data of four bits stored in two memory cells can be read out thoroughly by four times reading operation.

Although the present invention has been described upon the case where multi-valued storage is performed by an EEPROM having floating gate type memory cells, it is to be understood that not only floating gate type memory cells but also other type memory cells such as MNOS (metal nitride oxide semiconductor type memory cells may be used as memory cells for performing multi-valued storage.

The present invention can be also applied to a reading method in the case where multi-valued storage is performed by another storage device such as an EPROM or a PROM than the EEPROM and can be further applied to a reading method in the case where multi-valued storage is performed by a mask ROM in which, for example, the quantity of impurities ion-injected into the channel region of a field-effect transistor is controlled to thereby change the threshold value to obtain the storage state.

Although the aforementioned embodiments have shown the case where a storage capacity of two or three bits is given to one memory cell, it is to be understood that the present invention can be applied to the all case where a storage capacity of four values (two bits) or more is given to one memory cell and that the present invention is more effective as the storage capacity increases.

According to the reading method of the present invention, the number of times of reading operation subjected to each memory cell in a semiconductor storage device constituted by memory cells each having a storage capacity of four values or more is reduced, so that access time can be shortened.

What is claimed is:

1. A semiconductor storage device comprising:
   at least first and second memory cells connected serially to each other, each memory cell having a control gate and an electric charge accumulating layer, and a threshold value of a gate voltage of each memory cell being controlled to be one of a plurality of different values to thereby store data taking one of $2^n$ possible values where n is an integer greater than 1 in each memory cell;
   a voltage control circuit for applying voltages to the control gates of said at least first and second memory cells in accordance with a control signal;
   a sense amplifier for detecting whether or not a current flows across the serially connected at least first and second memory cells when said voltage control circuit applies voltages to the control gates of said at least first and second memory cells; and
   a signal control circuit for receiving an output signal of said sense amplifier and for outputting the control signal for controlling said voltage control circuit to (i) apply a first voltage having a value larger than a predetermined one of said plurality of different values to the control gate of said first memory cell and apply a preset voltage having a value larger than a maximum one of said plurality of different values to the control gate of the other memory cell, (ii) apply a second voltage having a value smaller than the value of the first voltage to the control gate of said first memory cell and apply the preset voltage to the control gate of the other memory cell when said sense amplifier detects a current flow due to application of the first voltage, (iii) apply a third voltage having a value larger than the value of the first voltage to the control gate of said first memory cell and apply the preset voltage to the control gate of the other memory cell when said sense amplifier detects no current flow in spite of application of the first voltage, (iv) apply a fourth voltage having a value larger than a predetermined one of said plurality of different values to the control gate of said second memory cell and apply the preset voltage to the control gate of the other memory cell, (v) apply a fifth voltage having a value smaller than the value of the fourth voltage to the control gate of said second memory cell and apply the preset voltage to the control gate of the other memory cell when said sense amplifier detects a current flow due to application of the fourth voltage, and (vi) apply a sixth voltage having a value larger than the value of the fourth voltage to the control gate of said second memory cell and apply the preset voltage to the control gate of the other memory cell when said sense amplifier detects no current flow in spite of application of the fourth voltage; whereby said data stored in each memory cell is read in fewer than $2^n-1$ operations.

2. A semiconductor storage device according to claim 1, wherein said electric charge accumulating layer includes a floating gate.

3. A semiconductor storage device according to claim 1, wherein each of the first to sixth voltages has substantially an average value of selected two of said plurality of different values.

4. A semiconductor storage device according to claim 1, wherein:
   the fourth voltage has the same value as that of the first voltage;
   the fifth voltage has the same value as that of the second voltage; and
   the sixth voltage has the same value as that of the third voltage.

5. A semiconductor storage device comprising:
   a plurality of memory cells connected serially to each other, each memory cell having a control gate and an electric charge accumulating layer, and a threshold value of a gate voltage of each memory cell being controlled to be one of a plurality of different values to thereby store data taking one of $2^n$ possible values where n is an integer greater than 1 in each memory cell;
   current detecting means for detecting whether a current flows across the serially connected plurality of memory cells when voltages are applied to the control gates of said plurality of memory cells; and
   a voltage control means for receiving an output signal of said current detecting means to (i) apply a first voltage having a value larger than a predetermined one of said plurality of different values to the control gate of a selected one of said plurality of memory cells and apply a present voltage having a value larger than a maximum one of said plurality of different values to the control gate(s) of the other memory cell(s), (ii) apply a second voltage having a value smaller than the value of the first voltage to the control gate of said selected memory cell and apply the preset voltage to the control gate(s) of the other memory cell(s) when said current detecting means detects a current flow due to application of the first voltage, and (iii) apply a third voltage having a value larger than the value of the first voltage to the control gate of said selected memory cell and apply the present voltage to the control gate(s) of the other memory cell(s) when said current detecting means detects no current flow in spite of application of the first voltage; whereby said data stored in each memory cell is read in fewer than $2^n-1$ operations.

6. A semiconductor storage device according to claim 5, wherein:
   said voltage control means includes a voltage control circuit for applying a selected one of the first, second and third voltages to the control gate of said selected memory cell and applying the preset voltage to the control gate(s) of the other memory cell(s) in accordance with a control signal, and a signal control circuit for generating the control signal and outputting it to said voltage control circuit;
   said current detecting means includes a sense amplifier for detecting whether a current flows across the serially connected plurality of memory cells when said voltage control signal applies the selected voltage and the preset voltage; and
   said signal control circuit generates the control signal on the basis of an output signal of said sense amplifier.

7. A semiconductor storage device according to claim 5, wherein said electric charge accumulating layer is a floating gate.

8. A semiconductor storage device according to claim 5, wherein each of the first, second and third voltages has substantially an average value of selected two of said plurality of different values.

9. A semiconductor storage device comprising:
   a plurality of transistors connected serially to each other, at least one of said plurality of transistors forming a non-volatile memory cell, and a threshold value of a gate voltage of said at least one transistor being controlled to be one of a plurality of different values by controlling an amount of impurities implanted into channel regions of said at least one transistor to thereby store data taking one of $2^n$ possible values where n is an integer greater than 1 in said non-volatile memory cell;
   current detecting means for detecting whether a current flows across the serially connected plurality of transistors when voltages are applied to control gates of said plurality of transistors; and
   a voltage control means for receiving an output signal of said current detecting means to apply a predetermined voltage to the control gate(s) of the other transistor(s) and apply to the control gate of said at least one transistor (i) a first voltage having a value larger than a predetermined one of said plurality of different values, (ii) a second voltage having a value smaller than the value of the first voltage when said current detecting means detects a current flow due to application of the first voltage, and (iii) a third voltage having a value larger than the value of the first voltage when said current detecting means detects no current flow in spite of application of the first voltage; whereby said data stored in said memory cell is read in fewer than $2^n-1$ operations.

10. A semiconductor storage device comprising:
    a NAND type block including a plurality of memory cells, each memory cell having a control gate and an electric charge accumulating layer, and a threshold value of a gate voltage of each memory cell being controlled to be one of a plurality of different values to thereby store data taking one of $2^n$ possible values where n is an integer greater than 1 in each memory cell;
    current detecting means for detecting whether a current flows across said NAND type block when voltages are applied to the control gates of said plurality of memory cells; and
    a voltage control means for receiving an output signal of said current detecting means to (i) apply a first voltage having a value larger than a predetermined one of said plurality of different values to the control gate of a selected one of said plurality of memory cells and apply a present voltage having a value larger than a maximum one of said plurality of different values to the control gate(s) of the other memory cell(s), (ii) apply a second voltage having a value smaller than the value of the first voltage to the control gate of said selected memory cell and apply the preset voltage to the control gate(s) of the other memory cell(s) when said current detecting means detects a current flow due to application of the first voltage, and (iii) apply a third voltage having a value larger than the value of the first voltage to the control gate of said selected memory cell and apply the present voltage to the control gate(s) of the other memory cell(s) when said current detecting means detects no current flow in spite of application of the first voltage; whereby said data stored in each memory cell is read in fewer than $2^n-1$ operations.

11. A semiconductor storage device comprising:
    a plurality of transistors connected serially to each other, at least one of said plurality of transistors forming a memory cell, and a threshold value of a gate voltage of said at least one transistor being controlled to be one of a plurality of different values to thereby store data taking one of $2^n$ possible values where n is an integer greater than 1 in said memory cell;

current detecting means for detecting whether a current flows across the serially connected plurality of transistors when voltages are applied to control gates of said plurality of transistors; and a voltage control means for receiving an output signal of said current detecting means to apply a predetermined voltage to the control gate(s) of the other transistor(s) and apply to the control gate of said at least one transistor (i) a first voltage having a value larger than a predetermined one of said plurality of different values, (ii) a second voltage having a value smaller than the value of the first voltage when said current detecting means detects a current flow due to application of the first voltage, and (iii) a third voltage having a value larger than the value of the first voltage when said current detecting means detects no current flow in spite of application of the first voltage; whereby said data stored in said memory cell is read in fewer than $2^n-1$ operations.

12. A semiconductor storage device according to claim 9, wherein each of said first, second and third voltages has substantially an average value of selected two of said plurality of different values.

13. A semiconductor storage device according to claim 10, wherein each of the first, second and third voltages has substantially an average value of selected two of said plurality of different values.

14. A semiconductor storage device according to claim 11, wherein each of the first, second and third voltages has substantially an average value of selected two of said plurality of different values.

15. A semiconductor storage device according to claim 1, wherein each of said at least first and second memory cells, includes a selected one of EEPROM (electrically erasable programmable read only memory), EPROM (erasable programmable read only memory), and PROM (programmable read only memory) and.

16. A semiconductor storage device according to claim 5, wherein each of said plurality of memory cells includes a selected one of EEPROM (electrically erasable programmable read only memory), EPROM (erasable programmable read only memory), and PROM (programmable read only memory) and MNOS (metal nitride oxide semiconductor).

17. A semiconductor storage device according to claim 9, wherein said non-volatile memory cell includes a selected one of EEPROM (electrically erasable programmable read only memory), EPROM (erasable programmable read only memory), and PROM (programmable read only memory).

18. A semiconductor storage device according to claim 10, wherein each of said plurality of memory cells includes a selected one of EEPROM (electrically erasable programmable read only memory), EPROM (erasable programmable read only memory), and PROM (programmable read only memory).

19. A semiconductor storage device according to claim 11, wherein said memory cell includes a selected one of EEPROM (electrically erasable programmable read only memory), EPROM (erasable programmable read only memory), and PROM (programmable read only memory) and.

20. A semiconductor storage device comprising:
a plurality of transistors connected serially to each other, at least one of said plurality of transistors forming a memory cell, and a threshold value of a gate voltage of said at least one transistor being controlled to be one of a plurality of different values by accumulating electric charge in a capacitor serially connected to a gate of said at least one transistor to thereby store data taking one of $2^n$ possible values where n is an integer greater than 1 in said memory cell;

current detecting means for detecting whether a current flows across the serially connected plurality of transistors when voltages are applied to gates of said plurality of transistors; and a voltage control means for receiving an output signal of said current detecting means to apply a predetermined voltage to gate(s) of the other transistor(s) and apply to the gate of said at least one transistor (i) a first voltage having a value larger than a predetermined one of said plurality of different values, (ii) a second voltage having a value smaller than the value of the first voltage when said current detecting means detects a current flow due to application of the first voltage, and (iii) a third voltage having a value larger than the value of the first voltage when said current detecting means detects no current flow in spite of application of the first voltage; whereby said data stored in said memory cell is read in fewer than $2^n-1$ operations.

21. A semiconductor storage device according to claim 20, wherein each of the first, second and third voltages has substantially an average value of selected two of said plurality of different values.

22. A semiconductor storage device comprising:
a plurality of transistors connected serially to each other, at least one of said plurality of transistors forming a memory cell, said memory cell having an electrode to accumulate electric charge, and a value of said electric charge accumulated in said electrode being controlled to be one of a plurality of different values to thereby store data of four values in said memory cell;

detecting means for performing less than three comparisons including (i) detecting whether a current flowing across said plurality of transistors has a value large than a first current value, (ii) detecting whether a current flowing across said plurality of transistors has a value larger than a second current value which is smaller than the first current value when said current flowing across said plurality of transistors has a value smaller than the first current value, and (iii) detecting whether a current flowing across said plurality of transistors has a value larger than a third current value which is larger than the first current value when said current flowing across said plurality of transistors has a value larger than the first current value.

23. A semiconductor storage device comprising:
at least first and second memory cells connected serially to each other, each memory cell having a control gate and an electric charge accumulating layer, and a threshold value of a gate voltage of each memory cell being controlled to be one of a plurality of different values to thereby store data of eight values in each memory cell;

detecting means performing less than seven comparisons for detecting whether a current flows across the serially connected at least first and second memory cells by (i) applying a first voltage having a value larger than a predetermined one of said plurality of different values to the control gate of said first memory cell and applying a preset voltage having a value larger than a maximum one of said plurality of different values to the control gate of the other memory cell, (ii) applying a second voltage having a value smaller than the value of the first voltage to the control gate of said first memory cell and applying the preset voltage to the control gate of the other memory cell when a current flow is detected due to application of the first voltage, (iii) applying a third voltage having a value larger than the value of the first voltage to the control gate of said first memory cell and applying the preset voltage to the control gate of the other memory cell when no current flow is detected in spite of application of the first voltage, (iv) applying a fourth voltage having a value larger than a predetermined one of said plurality of different values to the control gate of said second memory cell and applying the preset voltage to the control gate of the other memory cell, (v) applying a fifth voltage having a value smaller than the value of the fourth voltage to the control gate of said second memory cell and applying the preset voltage to the control gate of the other memory cell when a current flow is detected due to application of the fourth voltage, and (vi) applying a sixth voltage having a value larger than the value of the fourth voltage to the control gate of said second memory cell and applying the preset voltage to the control gate of the other memory cell when no current flow is detected in spite of application of the fourth voltage.

24. A semiconductor storage device according to claim 23, wherein said electric charge accumulating layer includes a floating gate.

25. A semiconductor device according to claim 23, wherein each of the first to sixth voltages has substantially an average value of selected two of said plurality of different values.

26. A semiconductor storage device according to claim 23, wherein:
the fourth voltage has the same value as that of the first voltage;
the fifth voltage has the same value as that of the second voltage; and
the sixth voltage has the same value as that of the third voltage.

27. A semiconductor storage device according to claim 23, wherein each of said at least first and second memory cells includes a selected one of EEPROM (electrically erasable programmable read only memory), EPROM (erasable programmable read only memory), and PROM (programmable read only memory) and.

28. A semiconductor storage device comprising:
a plurality of transistors connected serially to each other, at least one of said plurality of transistors forming a multi-value memory transistor, said multi-value memory transistor having a control gate electrode and an electric charge accumulating layer for storing data, said data taking one of $2^n$ possible values where n is an integer larger than 1;
voltage apply means for applying a plurality of different voltages to said control gate electrode, said voltage apply means including first voltage control means for applying a predetermined first voltage to said control gate electrode and second voltage control means for applying a second voltage having selected one of (i) a value larger than the first voltage and (ii) a value smaller than the first voltage to said control gate electrode on the basis of a current flowing through said multi-value memory transistor when said first voltage control means applies the first voltage;
read means for reading and determining data stored in said multi-value memory transistor by using said first and second voltage control means to perform less than $2^n-1$ operations where n is an integer larger than 1.

29. A semiconductor storage device according to claim 28, wherein said multi-value memory transistor is a non-volatile memory transistor.

30. A semiconductor storage device according to claim 28, wherein said plurality of transistors form a NAND block.

31. A semiconductor storage device comprising:
a plurality of transistors connected serially to each other, at least one of said plurality of transistors forming a multi-value memory transistor, a threshold value of a gate voltage of said multi-value memory transistor, a threshold value of a gate voltage of said multi-value memory transistor being controlled to be one of a plurality of different values to thereby store data of one of $2^n$ values where n is an integer larger than 1 in said multi-value memory transistor;
voltage apply means for applying to a gate of said multi-value memory transistor a predetermined first voltage and a second voltage which is selected from less than $2^n-1$ voltages on the basis of a current flowing through said multi-value memory transistor when the first voltage is applied;
read means for reading the data stored in said multi-value memory transistor after said voltage apply means applies at least said first and second voltages to the gate of said multi-value memory transistor.

32. A semiconductor storage device according to claim 31, wherein said multi-value memory transistor has an electric charge accumulating layer and the threshold value of the gate voltage of said multi-value memory transistor is controlled to be one of a plurality of different values by controlling an amount of electric charge accumulated on said electric charge accumulating layer.

33. A semiconductor storage device according to claim 31, wherein the threshold value of the gate voltage of said multi-value memory transistor is controlled to be one of a plurality of different values by controlling an amount of impurities implanted into channel regions of said multi-value memory transistor.

34. A semiconductor storage device according to claim 31, wherein each of said at least two different voltages has substantially an average value of selected two of said plurality of different values.

35. A semiconductor storage device according to claim 31, wherein said multi-value memory transistor includes a selected one of EEPROM (electrically erasable programmable read only memory), EPROM (erasable programmable read only memory), and PROM (programmable read only memory) and.

36. A semiconductor storage device according to claim 31, wherein said read means includes a current detecting means for detecting whether a current flows through a source and a drain of said multi-value memory transistor when said voltage apply means applies the selected voltage to the gate of said multi-value memory transistor.

37. A semiconductor storage device according to claim 22, wherein said memory cell includes a selected one of EEPROM (electrically erasable programmable read only memory), EPROM (erasable programmable read only memory), and PROM (programmable read only memory) and.

38. A semiconductor storage device comprising:
a plurality of transistors connected serially to each other, at least one of said plurality of transistors having a gate, a source and a drain and constituting a multi-value memory cell of a non-volatile type having an electric charge accumulating layer for storing data, said data taking one of $2^n$ possible values where n is an integer larger than 1, by accumulating electric charge; and detecting means for detecting a current flowing across the source and the drain of said transistor to compare an amount of the accumulated electric charge with less than $2^n-1$ reference values thereby detecting value of the data stored in said electric charge accumulating layer.

39. A semiconductor storage device according to claim 38, wherein:

each of said plurality of transistors constitutes a memory cell including a selected one of EEPROM (electrically erasable programmable read only memory), EPROM (erasable programmable read only memory), and PROM (programmable read only memory).

40. A semiconductor storage device comprising:

a plurality of transistors connected serially to each other, at least one of said plurality of transistors constituting a multi-value memory cell of a non-volatile type having an electric charge accumulating layer for accumulating electric charge, and an amount of the electric charge accumulated in said electric charge accumulating layer being controlled to be one of $2^n$ possible values where n is an integer larger than 1 to thereby store data in said multi-value memory cell; and detecting means for detecting a current flowing across a source and a drain of said transistor to compare the amount of the accumulated electric charge with less than $2^n-1$ reference values thereby detecting a value of the data stored in said multi-value memory cell.

41. A semiconductor storage device according to claim 40, wherein:

said memory cell includes a selected one of EEPROM (electrically erasable programmable read only memory), EPROM (erasable programmable read only memory), and PROM (programmable read only memory).

42. A semiconductor storage device comprising:

a plurality of transistors, each of said plurality of transistors having a gate, a source and a drain and constituting a multi-value memory cell of a non-volatile type having an electric charge accumulating layer for storing data, said data taking one of $2^n$ possible values where n is an integer larger than 1, by accumulating electric charge; and detecting means for detecting a current flowing across the source and the drain of said transistor to compare an amount of the accumulated electric charge with less than $2^n-1$ reference values thereby detecting a value of the data stored in said electric charge accumulating layer.

43. A semiconductor storage device according to claim 42, wherein:

each of said plurality of transistors constitutes a memory cell including a selected one of EEPROM (electrically erasable programmable read only memory), EPROM (erasable programmable read only memory), and PROM (programmable read only memory).

44. A semiconductor storage device according to claim 1, wherein each of said at least first and second memory cells is a non-volatile memory cell.

45. A semiconductor storage device according to claim 5, wherein each of said plurality of memory cells is a non-volatile memory cell.

46. A semiconductor storage device according to claim 10, wherein each of said plurality of memory cells is a non-volatile memory cell.

47. A semiconductor storage device according to claim 11, wherein said memory cell is a non-volatile memory cell.

48. A semiconductor storage device according to claim 20, wherein said memory cell is a non-volatile memory cell.

49. A semiconductor storage device according to claim 22, wherein said memory cell is a non-volatile memory cell.

50. A semiconductor storage device according to claim 23, wherein each of said at least first and second memory cells is a non-volatile memory cell.

51. A semiconductor storage device according to claim 31, wherein said multi-value memory transistor is a non-volatile memory transistor.

52. A semiconductor storage device comprising:

a plurality of transistors connected serially to each other, at least one of said plurality of transistors having a gate, a drain and a source and constituting a memory cell of a non-volatile type, and a threshold value of a gate voltage of said at least one transistor being controlled to be one of a plurality of different values to thereby store data indicating taking one of $2^n$ possible values where n is an integer greater than 1 in said memory cell;

a single sense amplifier for sensing said threshold value of the gate voltage of said at least one transistor; and control means for applying voltages to the gate of said at least one transistor and for (i) determining whether or not said threshold value is larger than a first reference value thereby outputting a first result, (ii) determining whether or not said threshold value is larger than a second reference value being lower than said first reference value thereby outputting a second result in a case where said threshold value was found less than said first reference value as indicated by said first result, and (iii) determining whether or not said threshold value is larger than a third reference value being higher than said first reference value thereby outputting a second result in a case where said threshold value was found larger than said first reference value as indicated by said first result; whereby said data stored in said memory cell is read in fewer than $2^n-1$ operations.

53. A semiconductor storage device according to claim 52, wherein said threshold value indicates one of n possible states where n is an integer larger than 2, said n possible states corresponding to predetermined ranges of said threshold value, respectively.

54. A semiconductor storage device according to claim 53, wherein a number of reference values is equal to n−1.

55. A semiconductor storage device according to claim 54, wherein n is equal to four.

56. A semiconductor storage device according to claim 55, wherein said semiconductor storage device further comprises means for indicating:

that said memory cell is in a first state when said threshold value is determined by said control means as being less than both of said first and second reference values;

that said memory cell is in a second state when said threshold value is determined by said control means as being less than said first reference value and larger than said second reference value;

that said memory cell is in a third state when said threshold value is determined by said control means as being larger than said first reference value and less than said third reference value; and that said memory cell is in a fourth state when said threshold value is determined by said control means as being larger than both of said first and third reference values.

57. A semiconductor storage device according to claim 53, wherein said first reference value corresponds to a threshold value between a n/2 state and a (n/2+1) state.

58. A semiconductor storage device according to claim 53, wherein said second reference value corresponds to a threshold value between a n/4 state and a (n/4+1) state.

59. A semiconductor storage device according to claim 53, wherein said third reference value corresponds to a threshold value between a 3n/4 state and a (3n/4+1) state.

60. A semiconductor storage device according to claim 52, wherein said first and second results are each expressed using a single binary bit.

61. A semiconductor storage device according to claim 52, wherein said memory cell includes a selected one of EEPROM (electrically erasable programmable read only memory), EPROM (erasable programmable read only memory) and PROM (programmable read only memory).

62. A semiconductor storage device comprising:

a plurality of transistors connected serially to each other, at least one of said plurality of transistors having a gate, a drain and a source and constituting a multi-valued memory cell of a non-volatile type for storing data in correspondence to one selected from at least three different threshold values;

first determining means for determining whether said data belongs to a first threshold value group including a plurality of threshold values or a second threshold value group including at least one threshold value other than the first threshold value group; and second determining means for determining which threshold value included in one of the first and second threshold value groups determined by said first determining means corresponds to said data when the determined threshold value group includes a plurality of threshold values.

63. A semiconductor storage device according to claim 62, wherein said first and second determining means are constructed of a voltage control circuit, a sense amplifier and a signal control circuit.

64. A semiconductor storage device according to claim 62, wherein said first determining means divides said at least three different threshold values in accordance with magnitude thereof into the first and second threshold value groups so that a number of threshold values included in the first threshold value group and a number of threshold values included in the second threshold value group are equal to each other or differ by one.

65. A semiconductor storage device according to claim 62, wherein said multi-valued memory cell of a non-volatile type has a floating gate for storing electric charge.

* * * * *